United States Patent [19]

Edwards

[11] 4,157,480

[45] Jun. 5, 1979

[54] INVERTERS AND LOGIC GATES EMPLOYING INVERTERS

[75] Inventor: Colin R. Edwards, Mangotsfield, England

[73] Assignee: National Research Development Corporation, London, England

[21] Appl. No.: 818,223

[22] Filed: Jul. 22, 1977

[30] Foreign Application Priority Data

Aug. 3, 1976 [GB] United Kingdom .............. 32197/76

[51] Int. Cl.² ..................... H03K 19/02; H03K 19/22; H03K 19/32; G11C 17/00
[52] U.S. Cl. .................................. 307/203; 307/213; 307/216; 307/217; 307/218; 365/96
[58] Field of Search .............. 307/203, 207, 213, 215, 307/216, 217, 218; 364/716; 365/96, 104

[56] References Cited

U.S. PATENT DOCUMENTS

| | | | |
|---|---|---|---|
| 3,134,032 | 5/1964 | Mann | 307/203 X |
| 3,705,357 | 12/1972 | Carter et al. | 307/216 X |
| 3,758,761 | 9/1973 | Henrion | 307/215 X |
| 3,849,638 | 11/1974 | Greer | 307/207 X |
| 3,990,045 | 11/1976 | Beausoleil | 307/207 X |
| 4,037,270 | 7/1977 | Ahmann et al. | 174/52 FP X |
| 4,064,493 | 12/1977 | Davis | 365/96 |

OTHER PUBLICATIONS

DeWitt et al., "Memory Array," *IBM Tech. Discl. Bull.;* vol. 10, No. 1, p. 95; 6/1967.
Brickman et al., "Programmable Logic Array Enhancement," *IBM Tech. Discl. Bull.;* vol. 19, No. 2, p. 583; 7/1976.

*Primary Examiner*—Larry N. Anagnos
*Attorney, Agent, or Firm*—Cushman, Darby & Cushman

[57] ABSTRACT

A so-called "programmable inverter" provides either a direct or an inverse signal path between its input and its output depending on a previously applied programming signal which is arranged to cause selective fusing of a fusible link. Such a circuit element may be incorporated in an input or an output of a logic gate so that a single type of gate may be programmed to perform a selected function from a number of functions.

10 Claims, 5 Drawing Figures

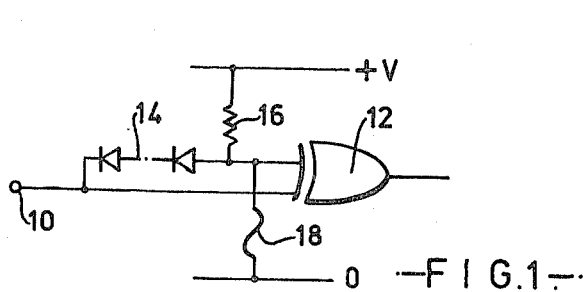
—FIG.1.—
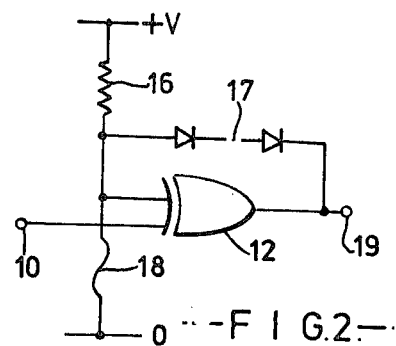
—FIG.2.—
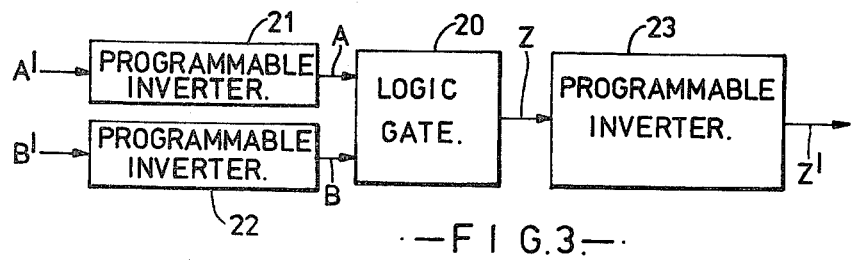
—FIG.3.—
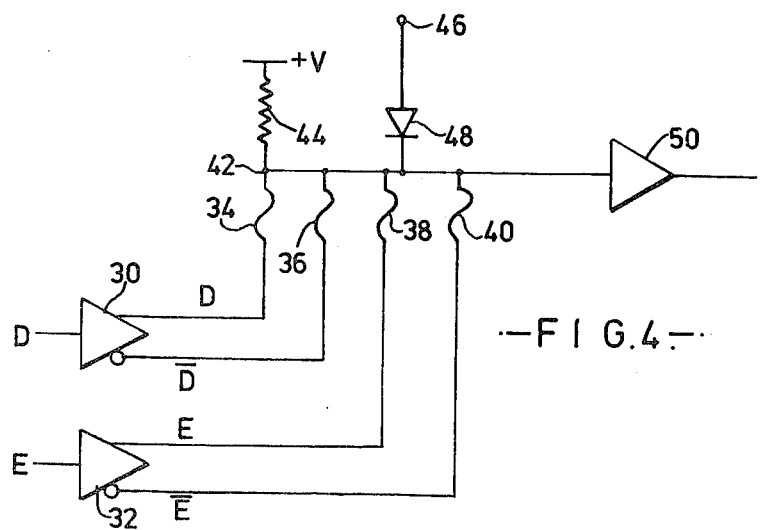
—FIG.4.—
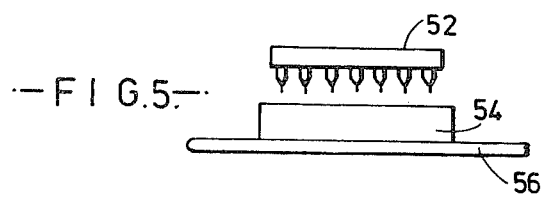
—FIG.5.—

INVERTERS AND LOGIC GATES EMPLOYING INVERTERS

This invention relates to inverters and logic gates employing inverters.

According to the invention, there is provided a circuit element having an input, an output, programmable means providing either a direct or an inverse signal path between the said input and said output and programming means responsive to a programming signal for determining whether said direct or said inverse path is subsequently operative. Such a circuit element is hereinafter referred to as a "programmable inverter."

According to a preferred form of the invention, there is provided a logic gate having at least one input and at least one output, at least one of said inputs and said output incorporating a programmable inverter.

The logic gate may take the form of any gate of the vertex type (AND/OR/NAND/NOR) and may also be an EXCLUSIVE-OR or an EXCLUSIVE-NOR gate.

Preferably the state of the or each programmable inverter is determined by the combinations of electrical signals applied to the inputs or the outputs of such inverters usually in combination with a separate programming signal.

Embodiments of the invention will now be described by way of example with reference to the accompanying drawing, in which:

FIGS. 1 and 2 are schematic circuit diagrams of a programmable inverter in accordance with the invention, FIG. 3 is a schematic diagram of a logic gate incorporating programmable inverters of the type shown in FIG. 1 or FIG. 2, FIG. 4 is a schematic circuit diagram of an alternative implementation of the gate shown in FIG. 3, and FIG. 5 is a side view of a socket for an integrated circuit package.

Referring to FIG. 1, a programmable inverter in accordance with the invention has its input terminal 10 directly connected to one input of an EXCLUSIVE-OR gate 12 the output of which forms the output of the inverter. The input terminal 10 is also connected to the other input of the EXCLUSIVE-OR gate 12 by a diode stack 14. This second input of the EXCLUSIVE-OR gate is also connected to a reference voltage +V (logical 1) by a resistor 16 and to reference voltage 0 (logical 0) by a fusible link 18.

If no programming signal is applied, the fusible link 18 holds the second input of the EXCLUSIVE-OR gate at logic 0. The current in the fusible link 18 is insufficient to cause fusing and the diode stack 14 has an overall forward conduction voltage which exceeds the switching threshold of the gate 12. Consequently the same logical signal appears at the output of the EXCLUSIVE-OR gate 12 as is applied to the input 10.

The inverter can be programmed into the invert mode by applying to the input 10 a negative voltage so as to cause a current to flow through the diode stack 14 and the fusible link 18, such current being of sufficient magnitude to fuse the latter so that it becomes open circuit. Thereafter, in normal use, the resistor 16 holds the second input of the EXCLUSIVE-OR gate 12 at logical 1 so that the logical output of the gate 12 is the inverse of the signal applied at the input 10.

The diode stack 14 may be replaced by a diode stack 17 connected between the second input of the EXCLUSIVE-OR gate 12 and the output 19 thereof, as shown in FIG. 2. The circuit operates as before except that, when it is desired to fuse the link 20, the negative voltage is applied to the output 19 instead of to the input 10.

FIG. 3 shows a logic gate 20 employing programmable inverters in accordance with the invention.

The gate 20 has its two inputs A and B connected to the outputs of respective programmable inverters 21 and 22 and its output Z connected to a programmable inverter 23. All of the programmable inverers 21, 22 and 23 may be as illustrated in FIG. 1. Input signals A' and B' are applied to the inverters 21 and 22 and the inverter 23 produces and output Z'. The possible functions synthesised by this circuit when the logic gate 20 is either an AND gate or an EXCLUSIVE-OR gate are shown in the following table:

| State of Programmable Inverter 21 | State of Programmable Inverter 22 | State of Programmable Inverter 23 | Implementation of Logic Gate 20 | Programmable Logic Gate Function Implementation |
|---|---|---|---|---|
| $A=\overline{A'}$ | $B=\overline{B'}$ | $Z=\overline{Z'}$ | AND | $Z' = \overline{\overline{A'}.\overline{B'}} = A' + B'$ |
| $A=\overline{A'}$ | $B=B'$ | $Z=\overline{Z'}$ | AND | $Z' = \overline{\overline{A'}.B'} = A' + \overline{B'}$ |
| $A=A'$ | $B=\overline{B'}$ | $Z=\overline{Z'}$ | AND | $Z' = \overline{A'.\overline{B'}} = \overline{A'} + B'$ |
| $A=A'$ | $B=B'$ | $Z=\overline{Z'}$ | AND | $Z' = \overline{A'.B'} = \overline{A'} + \overline{B'}$ |
| $A=\overline{A'}$ | $B=\overline{B'}$ | $Z=Z'$ | AND | $Z' = \overline{A'}.\overline{B'} = \overline{A' + B'}$ |
| $A=\overline{A'}$ | $B=B'$ | $Z=Z'$ | AND | $Z' = \overline{A'}.B' = \overline{A' + \overline{B'}}$ |
| $A=A'$ | $B=\overline{B'}$ | $Z=Z'$ | AND | $Z' = A'.\overline{B'} = \overline{\overline{A'} + B'}$ |
| $A=A'$ | $B=B'$ | $Z=Z'$ | AND | $Z' = A'.B' = \overline{\overline{A'} + \overline{B'}}$ |
| $A=\overline{A'}$ | $B=B'$ | $Z=Z'$ | EXCLUSIVE-OR | $Z' = A'.B' + \overline{A'}.\overline{B'} = A' \oplus B'$ |
| $A=\overline{A'}$ | $B=\overline{B'}$ | $Z=Z'$ | EXCLUSIVE-OR | $Z' = A'.\overline{B'} + \overline{A'}.B' = A' \oplus B'$ |

(where $\oplus$ indicates an EXCLUSIVE-OR function)

FIG. 4 shows an alternative implementation of the circuit shown in FIG. 2 for use when the logic gate 20 is to be an AND gate. The two inputs D and E are connected to respective invert/non-invert circuits 30 and 32, each of which has two outputs comprising signals which are the same as and the inverse of the input respectively. Each of these four outputs is connected by a respective fusible link 34, 36, 38, 40 to a node 42. The node 42 is also connected to a reference voltage +V by a resistor 44, to a programming terminal 46 by a diode 48, and directly to the input of an output buffer 50, the output of which forms the output of the circuit.

In use, a positive programming voltage is applied to the terminal 46 and, at the same time, each of the inputs D and E is set to either logical 1 or logical 0. If the input D is logical 1, the link 36 is fused, while if it is logical 0, the link 34 is fused. Similarly if the input E is logical 1, the link 40 is fused, while if it is logical 0, the link 38 is fused. Thus, logical 1 is applied to the invert/non-invert circuit of an input which is required to be an inverting input while logical 0 is applied to the invert/non-invert circuit of an input which is required to be a direct input.

In subsequent use, either the direct or inverted output from each of the circuits 30 and 32 is applied by the corresponding surviving fusible link to the node 42 which, together with the resistor 44, forms a wired-AND gate. The diode 48 prevents signals on the node 42 from being affected by the signals on nodes of other logic gates supplied from the same programming voltage source.

FIG. 5 shows an integrated circuit 52 suitable for connection to a socket 54 mounted on a printed circuit board 56. Each connector of the socket, except for the power supply connectors, incorporates a programmable inverter, for example as illustrated in FIG. 1. Since such a programmable inverter is a one-way device, it is necessary to predesignate some of the connectors of the socket as input connections and others as output connections and install the programmable inverter in the socket accordingly. Power for the programmable inverters is taken from the power supply connections of the socket. This arrangement not only eliminates the need to provide inverter packages on the printed circuit board, thereby simplifying the layout thereof, but also enables a better utilisation to be made of existing integrated circuits. For example, an OR gate can be converted to an AND gate by providing inverters as its output and/or of its input. Thus, only one type of integrated circuit package is needed to provide all vertex functions and, in general, fewer packages will be only partially utilised.

I claim:

1. A circuit element having an input, an output, programmable means including a fusible link and providing either a non-inverting signal path between the said input and output or an inverting signal path between said input and said output, one of said signal paths being operative when said link is intact and the other being operative when said link is fused, and programming means responsive to a programming signal to cause fusing of said link.

2. A circuit element according to claim 1, wherein said programming means includes a diode in series with said fusible link, to allow passage of a fusing current through said link on application of a programming signal thereto.

3. A circuit element according to claim 2, comprising an EXCLUSIVE-OR gate, the output of which comprises the output of the circuit element, having a first input directly connected to the input of the circuit element and a second input connected to the input of the circuit element by said diode, the second input of the EXCLUSIVE-OR gate also being connected by a resistor to means for applying a first reference voltage and by a fusible link to means for applying a second reference voltage.

4. A circuit element according to claim 2, comprising an EXCLUSIVE-OR gate, the output of which comprises the output of the circuit element, having a first input directly connected to the input of the circuit element and a second input connected to the output of the circuit element by said diode, the second input of the EXCLUSIVE-OR gate also being connected by a resistor to means for applying a first reference voltage and by a fusible link to means for applying a second reference voltage.

5. A circuit element according to claim 2, wherein each of said two signal paths includes a respective fusible link in series therewith, the fusible link being directly connected to the output of the circuit element which is also connected to the diode of the programming means.

6. An AND gate having a plurality of inputs, each input comprising a respective input circuit adapted to produce a first output of the same polarity as its input at a first output terminal and a second output of opposite polarity to its input at a second output terminal, the first and second output terminals of each input circuit being connected by a first and second fusible link, respectively, to a common circuit point, a resistor connecting said common circuit point to a reference voltage and a diode connecting said common circuit point to an input terminal for recieving a programming signal whereby one or the other of said fusible links is fused depending on the input signal at such input when the programming signal is applied.

7. A logic gate having at least one input port and at least one output port, at least one of said ports incorporating a circuit element having an input, an output, programmable means including a fusible link and providing either a non-inverting signal path between the said input and output or an inverting signal path between said input and said output, one of said signal paths being operative when said link is intact and the other being operative when said link is fused, and programming means responsive to a programming signal to cause fusing of said link.

8. A logic gate according to claim 7, comprising an AND gate.

9. A logic gate according to claim 7, comprising an EXCLUSIVE-OR gate.

10. A mounting arrangement for an integrated circuit package comprising a socket having a connector for each electrical connection of the integrated circuit, at least one of said connectors comprising a circuit element having an input, an output, programmable means including a fusible link and providing either a non-inverting signal path between the said input and output or an inverting signal path between said input and said output, one of said signal paths being operative when said link is intact and the other being operative when said link is fused, and programming means responsive to a programming signal to cause fusing of said link.

* * * * *